US012610875B2

(12) United States Patent
Hsieh et al.

(10) Patent No.: US 12,610,875 B2
(45) Date of Patent: Apr. 21, 2026

(54) PACKAGE STRUCTURE HAVING SECOND ADHESIVE BETWEEN SIDE SURFACE OF SEMICONDUCTOR PACKAGE AND FIRST ADHESIVE

(71) Applicant: WISTRON NEWEB CORPORATION, Hsinchu (TW)

(72) Inventors: Kuo-Hua Hsieh, Hsinchu (TW); Chao-Chieh Chan, Hsinchu (TW); Yu-Da Dong, Hsinchu (TW); Chun-Jen Cheng, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 391 days.

(21) Appl. No.: 18/183,208

(22) Filed: Mar. 14, 2023

(65) Prior Publication Data

US 2024/0047323 A1    Feb. 8, 2024

(30) Foreign Application Priority Data

Aug. 2, 2022    (TW) .................................. 111128856

(51) Int. Cl.
| | |
|---|---|
| *H10W 90/00* | (2026.01) |
| *H10W 20/40* | (2026.01) |
| *H10W 70/05* | (2026.01) |

(52) U.S. Cl.
CPC ......... *H10W 90/701* (2026.01); *H10W 20/40* (2026.01); *H10W 70/095* (2026.01)

(58) Field of Classification Search
CPC ......... H01L 23/49816; H01L 23/4828; H10W 90/701; H10W 20/40; H10W 70/095
See application file for complete search history.

(56) References Cited

U.S. PATENT DOCUMENTS

| | | | | |
|---|---|---|---|---|
| 2011/0147912 A1* | 6/2011 | Karpur | .................. | H01L 21/563 |
| | | | | 257/E23.129 |
| 2018/0233423 A1* | 8/2018 | Lobianco | .............. | H01L 23/315 |
| 2019/0096868 A1* | 3/2019 | Tsou | ...................... | H01L 23/295 |
| 2021/0343677 A1* | 11/2021 | Atadana | ................ | H01L 21/563 |
| 2021/0375711 A1* | 12/2021 | Shen | ........................ | H01L 24/92 |
| 2022/0230990 A1* | 7/2022 | Yew | ...................... | H01L 21/561 |

* cited by examiner

*Primary Examiner* — Michael Jung
(74) *Attorney, Agent, or Firm* — McClure, Qualey & Rodack, LLP

(57) ABSTRACT

A package structure and a method for fabricating the same are provided. The package structure includes a substrate, a semiconductor package, a first adhesive and a second adhesive. The substrate has a first board surface and a second board surface, and a second region surrounds a first region on the first board surface. The semiconductor package has an upper surface, a lower surface, and a side surface, and is disposed on the first board surface. The first adhesive is formed on the first board surface, in the second region and in a portion of the first region adjacent to the second region. The second adhesive is formed between the side surface and the first adhesive and contacts the side surface and the first adhesive, and the first adhesive and the second adhesive together form a pier adhesive.

15 Claims, 23 Drawing Sheets

100

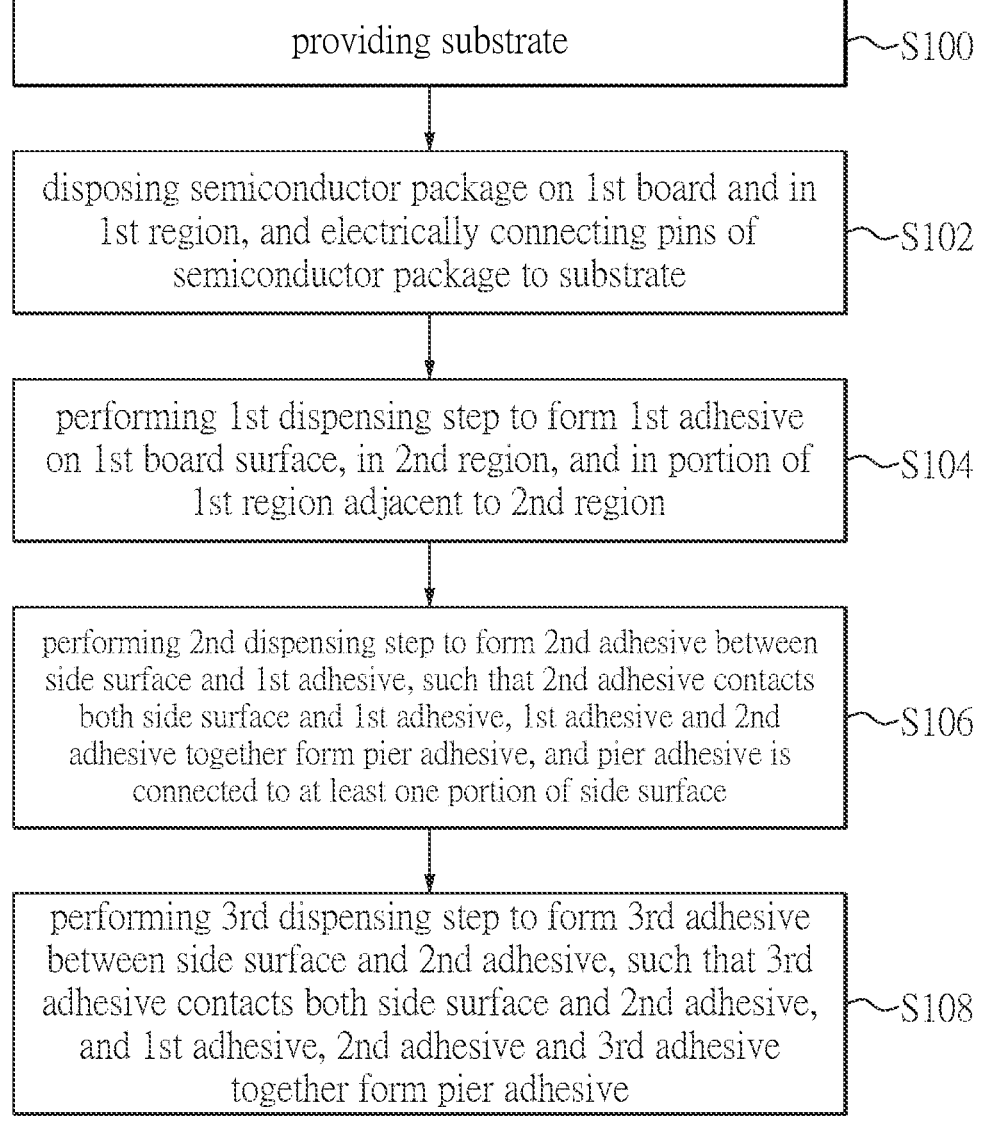

providing substrate ⟩～S100 disposing semiconductor package on 1st board and in 1st region, and electrically connecting pins of semiconductor package to substrate ⟩～S102 performing 1st dispensing step to form 1st adhesive on 1st board surface, in 2nd region, and in portion of 1st region adjacent to 2nd region ⟩～S104 performing 2nd dispensing step to form 2nd adhesive between side surface and 1st adhesive, such that 2nd adhesive contacts both side surface and 1st adhesive, 1st adhesive and 2nd adhesive together form pier adhesive, and pier adhesive is connected to at least one portion of side surface ⟩～S106 performing 3rd dispensing step to form 3rd adhesive between side surface and 2nd adhesive, such that 3rd adhesive contacts both side surface and 2nd adhesive, and 1st adhesive, 2nd adhesive and 3rd adhesive together form pier adhesive ⟩～S108

PACKAGE STRUCTURE HAVING SECOND ADHESIVE BETWEEN SIDE SURFACE OF SEMICONDUCTOR PACKAGE AND FIRST ADHESIVE

CROSS-REFERENCE TO RELATED PATENT APPLICATION

This application claims the benefit of priority to Taiwan Patent Application No. 111128856, filed on Aug. 2, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a method for fabricating the same, and more particularly to a package structure and a method for fabricating the same that can effectively control an amount of underneath penetration during a side-fill dispensing process.

BACKGROUND OF THE DISCLOSURE

For conventional semiconductor devices or packages in multi-chip modules (MCM) or systems, polymer underfill dispensing or side-fill (or edge bond) dispensing are widely utilized in the packaging process to ensure reliability of solder ball contacts or solder joints.

In addition, above products after shipment should be able to pass at least three reflow processes and applicable qualification tests, including multiple reliability tests and failure mechanism based tests (for example, the AEC-Q104 qualification), to meet customer needs or relevant industrial standards (e.g., JEDEC J-STD-020 moisture/reflow sensitivity classification for nonhermetic surface mount devices). Furthermore, the area underneath semiconductor component must be completely cleaned and dried before the under-fill dispensing process, and the adhesive should be completely filled during the dispensing process. Therefore, such cleaning (chemical or water cleaning), baking, plasma treatment and pressure curing requirements not only generate additional manufacturing costs, but also the process variances (ex. underfill void, handling issues) affecting the performance of the products in the subsequent reflow processes.

Although the underfill dispensing that requires the adhesive to be completely filled can be replaced by the side-fill dispensing, during the side-fill dispensing, excessive underneath adhesive penetration of the component may cause the adhesive to wrap around solder balls or solder joints, and such solder balls or solder joints in the subsequent reflow processes may be affected by thermal expansions of heterogeneous materials, such as voids in high-temperature molten solder balls and solder joints or volatilization of flux, which can even lead to defects such as solder ball deformation, open circuits and short circuits of the solder joints.

Therefore, how a shape of packing adhesive can be accurately controlled in a low-cost manner by improving the package structure and the packaging process, while ensuring that the packaged product is capable to meet requirements of reflow processes, has become one of the important issues to be addressed in the art.

SUMMARY OF THE DISCLOSURE

In response to the above-referenced technical inadequacies, the present disclosure provides a package structure and a method for fabricating the same that can effectively control an amount of underneath penetration during a side-fill dispensing process.

In one aspect, the present disclosure provides a package structure, which includes a substrate, a semiconductor package, a first adhesive and a second adhesive. The substrate has a first board surface and a second board surface, a first region is located on the first board surface, and a second region is located on the first board surface and surrounds the first region. The semiconductor package has an upper surface, a lower surface, and a side surface between the upper surface and the lower surface. The semiconductor package is disposed on the first board surface and located in the first region, and is electrically connected to the substrate through a plurality of pins disposed on the lower surface. The first adhesive is formed on the first board surface, in the second region and in a portion of the first region adjacent to the second region. The second adhesive is formed between the side surface and the first adhesive. The second adhesive contacts the side surface and the first adhesive at the same time, the first adhesive and the second adhesive together form a pier adhesive, and the pier adhesive is connected to at least one portion of the side surface.

In another aspect, the present disclosure provides a method for fabricating a package structure, and the method includes: providing a substrate, in which the substrate has a first board surface and a second board surface, a first region is located on the first board surface, and a second region is located on the first board surface and surrounds the first region; disposing a semiconductor package on the first board and in the first region, and electrically connecting a plurality of pins of the semiconductor package to the substrate, in which the semiconductor package has a lower surface, an upper surface opposite to the lower surface, and a side surface between the upper surface and the lower surface, and the plurality of pins are disposed on the lower surface; performing a first dispensing step to form a first adhesive on the first board surface, in the second region and a portion of the first region adjacent to the second region; and performing a second dispensing step to form a second adhesive between the side surface and the first adhesive, The second adhesive contacts the side surface and the first adhesive at the same time, such that the first adhesive and the second adhesive together form a pier adhesive, and the pier adhesive is connected to at least one portion of the side surface.

Therefore, in the package structure and the method for fabricating the same provided by the present disclosure, a fillet height and a fillet width of a pier adhesive on the side surface can be precisely controlled by a two-stage or multi-stage dispensing process, such that sides of the semiconductor package can be strengthened to avoid abnormalities such as cracks in solder joints or open circuits, and the product reliability can be increased.

In addition, in the package structure and the method for fabricating the same provided by the present disclosure, a pier structure formed by the two or multi-stage dispensing process can be utilized to precisely control the underneath penetration of the component, thereby avoiding defects such as deformation of solder balls, disconnection of solder joints, and interface delamination between the adhesive and the component or the printed circuit board/substrate. Therefore, processes such as module cleaning, baking and plasma treatment required for the conventional underfill dispensing or the side-fill dispensing can be omitted, which greatly reduces the overall production costs.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a flowchart of a method for fabricating a package structure according to one embodiment of the present disclosure;

DETAILED DESCRIPTION OF THE EXEMPLARY EMBODIMENTS

Figure 2:
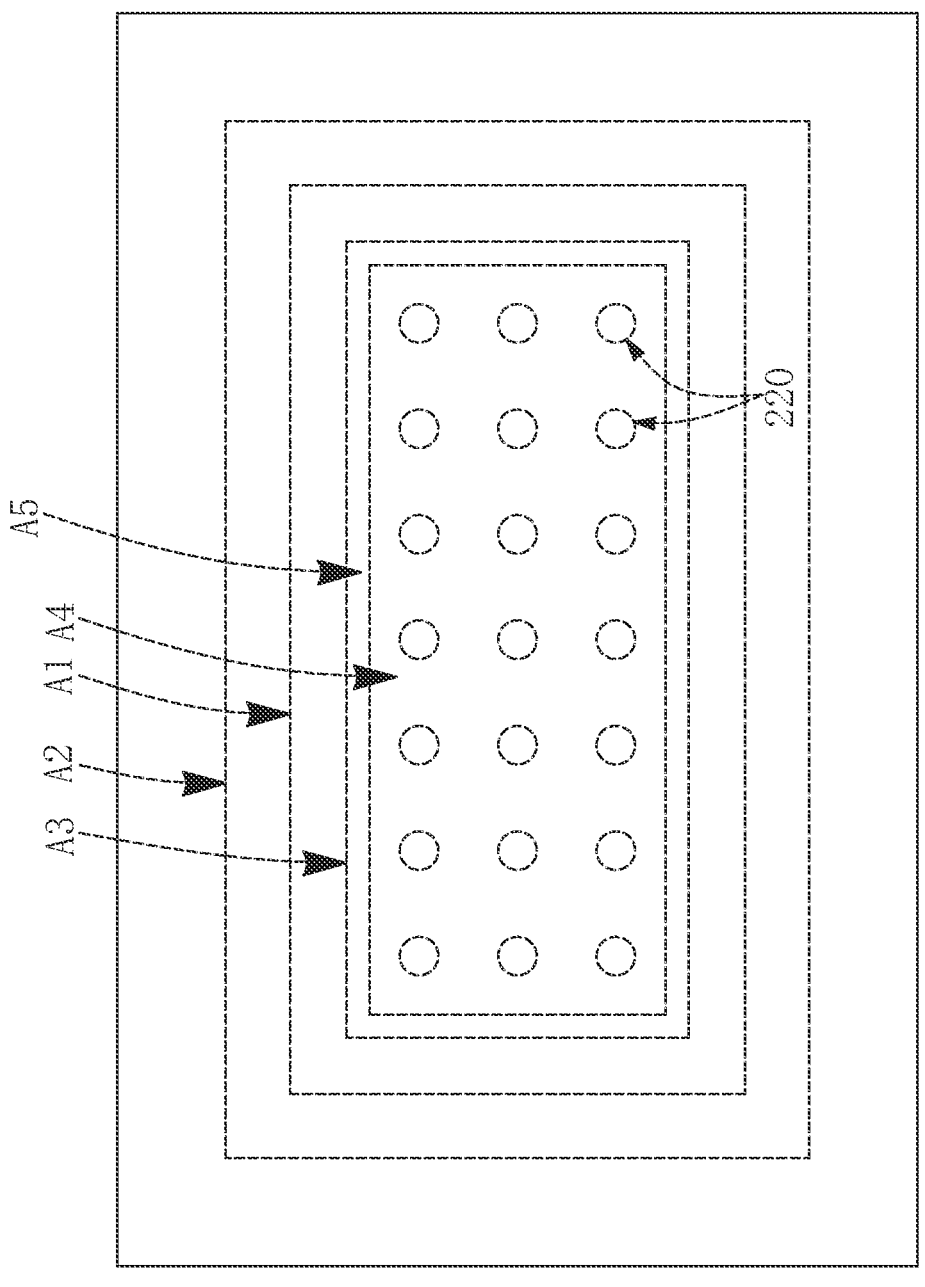
FIG. 2 is a schematic top view of a substrate according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
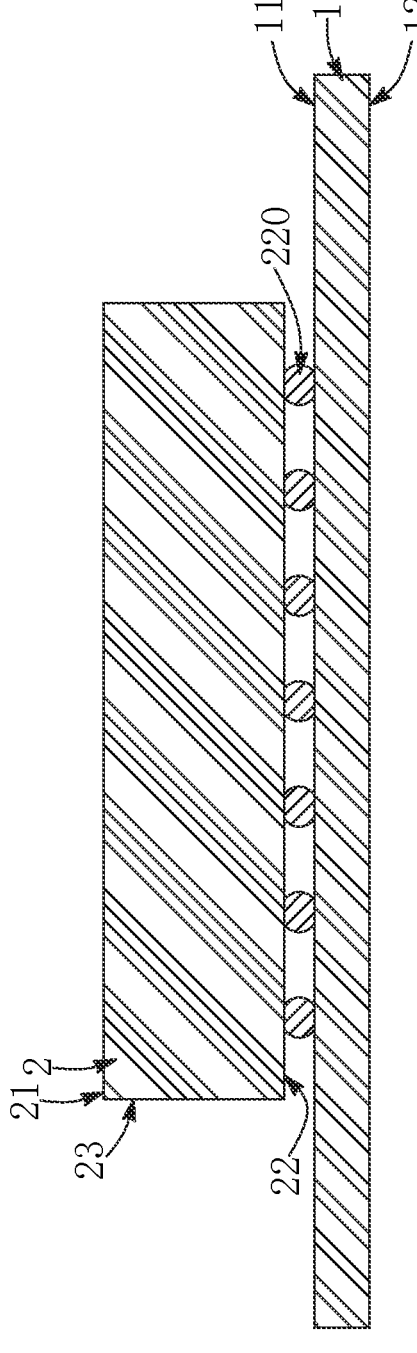
FIG. 3 is a schematic side view of a substrate, a semiconductor package and a first adhesive according to one embodiment of the present disclosure.

FIG. 1 is a flowchart of a method for fabricating a package structure according to one embodiment of the present disclosure. Referring to FIG. 1, one embodiment of the present disclosure provides a method for fabricating a package structure, and the method includes the following steps:

Step S100: providing a substrate. Reference can be made to FIGS. 2 and 3, FIG. 2 is a schematic top view of a substrate according to one embodiment of the present disclosure, and FIG. 3 is a schematic side view of a substrate, a semiconductor package and a first adhesive according to one embodiment of the present disclosure. As shown in FIG. 2 and FIG. 3, the substrate 1 has a first board surface 11 and a second board surface 12, a first region A1 is located on the first board surface 10, and a second region A2 surrounds the first region A1.

Step S102: disposing a semiconductor package on the first board and in the first region, and electrically connecting a plurality of pins of the semiconductor package to the substrate.

As shown in FIG. 3, the semiconductor package 2 can be an integrated circuit (IC) chip, which is a chip that integrates hundreds to millions or more components. The semiconductor package 2 has an upper surface 21, a lower surface 22 opposite to the upper surface 21, and a side surface 23 between the upper surface 21 and the lower surface 22. A plurality of pins 220 are disposed on the lower surface 22 and can be arranged in a grid-like manner to cover the lower surface 22, such that electronic signals can be conducted from the IC to the printed circuit board (PCB) where it is located. It should be noted that, referring to FIG. 2, the lower surface 22 is divided into an inner region A4 and an outer region A5 surrounding the inner region A4, the plurality of pins 220 are arranged in the inner region A4, and the inner region A4 and the outer region A5 are presented in a form of rectangular boxes formed by broken lines in FIG. 2. In some embodiments, the pins 220 can be solder balls or solder joints. The solder balls can serve as the connection points between a ball grid array (BGA) package and a circuit board, and are placed on the bottom of the BGA package using the BGA process. The solder joints can be connections formed between two metal surfaces by heating the metal surfaces and applying solders, which melt and flow into the joints to create solid and reliable connections. The solder balls are spherical deposits of solder, while the solder joints are connections formed by flowing solder wire or solder strip between two metal surfaces.

In FIG. 2, the semiconductor package 2 is disposed on the first board surface 11 of the substrate 1, and is located in the first region A1. More precisely, the semiconductor package 2 can be disposed in a pre-planned third region A3 on the first board surface 11. In addition, the semiconductor package 2 and the substrate 1 can be combined in a form of a flip chip (FC) package, a wafer level package (WLP), a quad flat no-Lead (QFN) package or a dual flat no-lead (DFN) package, such that the semiconductor package 2 can be electrically connected to the substrate 1 through the plurality of pins 220, and the pins 220 can be connected to the semiconductor package 2 and the substrate 1 by soldering. For example, the plurality of pins 220 are electrically connected to the substrate 1 in a ball grid array packaging manner, that is, multiple soldering balls are arranged in an array to form ball contacts on the lower surface 22 to serve as the pins 220. In other embodiments, the bottom surface 22 can also be packaged in the QFN packaging manner with a plurality of bottom terminal components (BTC) that serve as the pins 220.

Step S104: performing a first dispensing step to form a first adhesive on the first board surface, in the second region, and in a portion of the first region adjacent to the second region.

In general, a dispensing process, such as underfill dispensing or side-fill dispensing, is utilized in a packaging process to ensure reliability of solder ball joints. A profile of the formed adhesive can be determined by controlling a viscosity and a temperature of a dispensing fluid, a height and a pressure of the dispensing fluid in a needle cylinder, an inner diameter and length of a needle tip, and a dispensing amount and a shape of the adhesive.

Figure 4A:
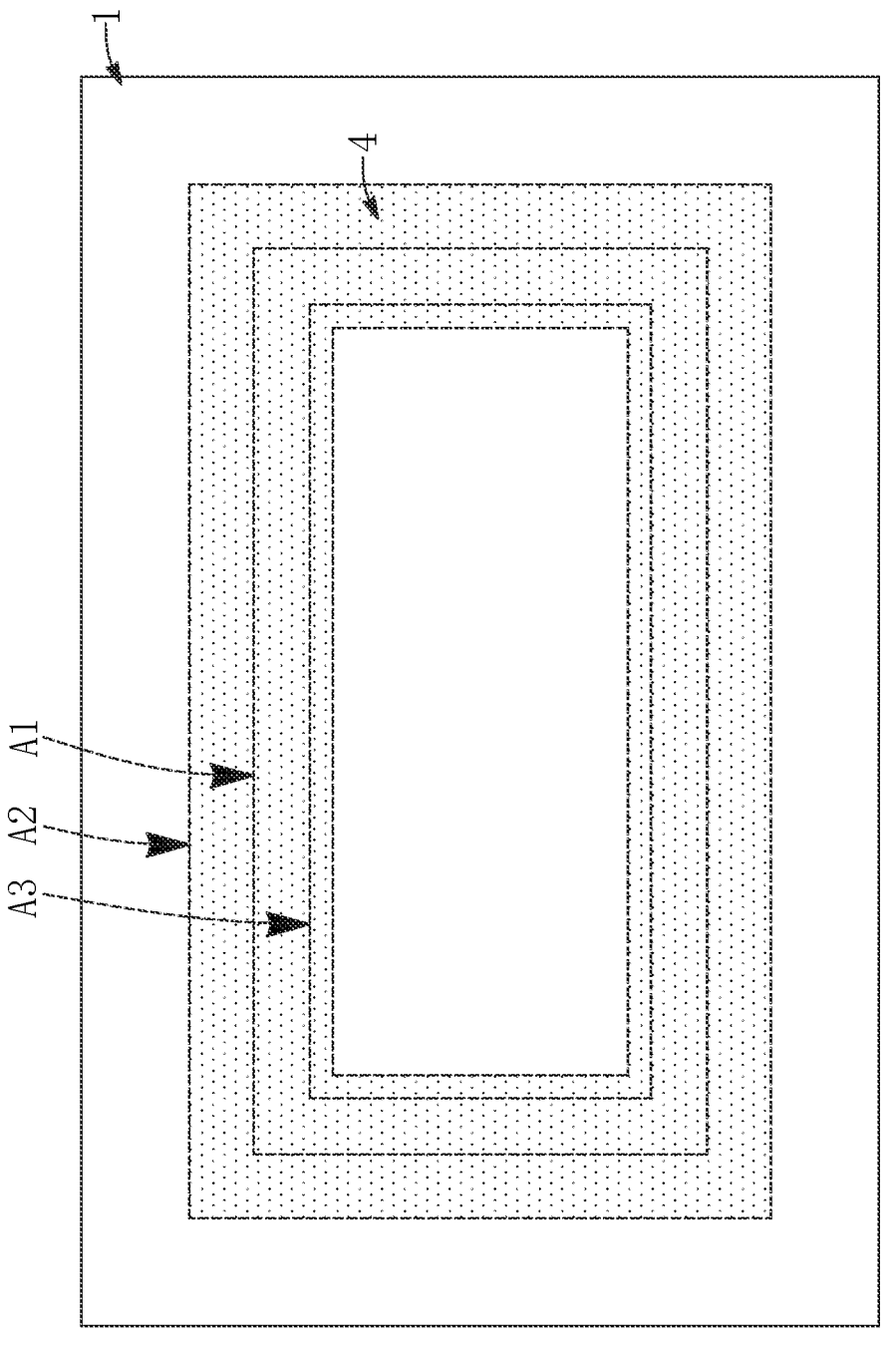
FIGS. 4A and 4B are a schematic top view and a schematic side view of step S104 according to one embodiment of the present disclosure, respectively.
Figure 4B:
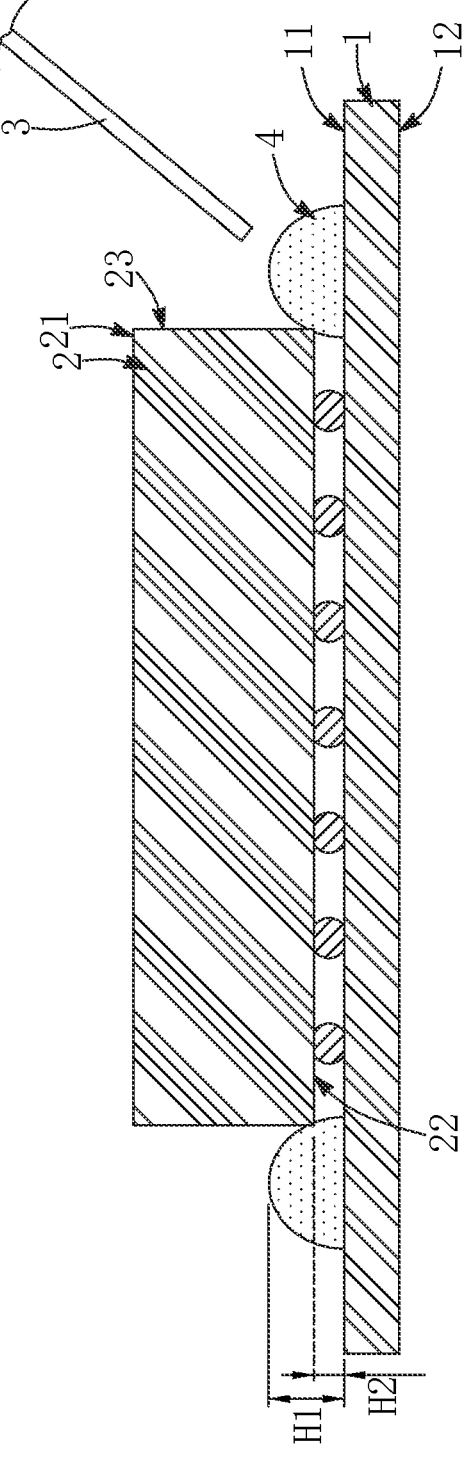
Figure 4C:
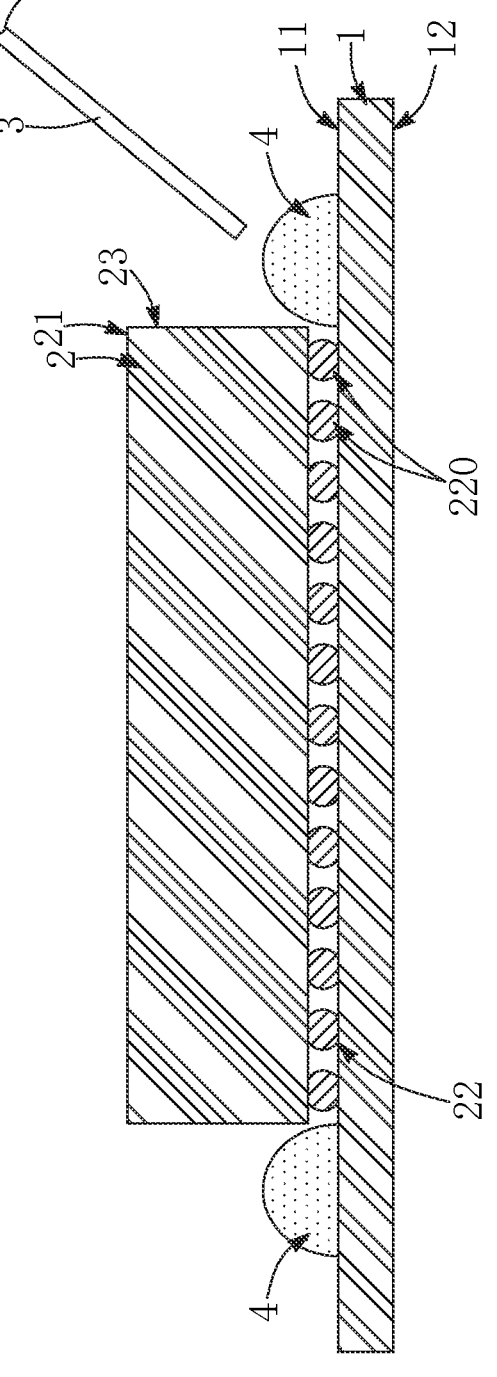
FIG. 4C is another schematic side view of step S104 according to one embodiment of the present disclosure.

Reference is made to FIGS. 4A, 4B and 4C, FIGS. 4A and 4B are a schematic top view and a schematic side view of step S104 according to one embodiment of the present disclosure, respectively, and FIG. 4C is another schematic side view of step S104 according to one embodiment of the present disclosure. As shown in FIG. 4A and FIG. 4B, a first adhesive 4 can be disposed, through the needle cylinder 3, on the first board surface 11 along the side surface 23 of the semiconductor package 2, in the second region A2 shown in FIG. 4A, and in a portion of the first region A1 adjacent to the second region A2.

It can be seen from FIG. 4A that, in one embodiment of the present disclosure, a method that can effectively control underneath penetration of the side dispensing is utilized; that is, a segmented pier-dispensing method from the outside to the inside is used to make sure that the first adhesive 4 does not penetrate into the bottom of the semiconductor package 2 before the adhesive is formed with a base width. For example, the first adhesive 4 may not contact the side surface 23 of the semiconductor package 2 in an initial state immediately after being dispensed, but may contact a part of the side surface 23 and a part of the lower surface 22 after a shape of the first adhesive 4 is stabilized. For example, the first adhesive 4 may contact the outer area A5 of the lower surface 22, but the present disclosure is not limited thereto. It should be noted that a height H1 of the first adhesive 4 that is in the initial state or after the shape thereof is stabilized is at least higher than a height H2 of the lower surface 22, but the first adhesive 4 does not contact any one of the pins 220 either in the initial state or after the shape thereof is stabilized.

In some embodiments, the pins 220 may be positioned very close to the side surfaces 23 of the semiconductor package 2, as shown in FIG. 4C. In this case, the adhesive may contact the pins 220 if the adhesive is dispensed in the conventional manner. Therefore, for such pins 220, the first adhesive 4 can be arranged at a distance from the side surface 23 of the semiconductor package 2, such that the first adhesive 4 does not contact the semiconductor package 2 in the initial state, and does not contact the side surface 23 and the lower surface 22 after the shape of the first adhesive 4 is stabilized.

In addition, in one embodiment of the present disclosure, adhesive materials with specific characteristics can be selected. Reference is made to the following table I:

| Adhesive properties | Recommended ranges |
|---|---|
| Viscosity 25° C. (Pa · s) | ≥30 |
| Thixotropy | ≥1 |
| Glass transition temperature Tg (° C.) | ≥120 |
| Coefficient of thermal expansion (CTE) | ≤130 |
| Modulus 25° C. (Gpa) | 6~15 |

Step S106: performing a second dispensing step to form a second adhesive between the side surface and the first adhesive, such that the second adhesive contacts both the side surface and the first adhesive, the first adhesive and the second adhesive together form a pier adhesive, and the pier adhesive is connected to at least one portion of the side surface.

Figure 5A:
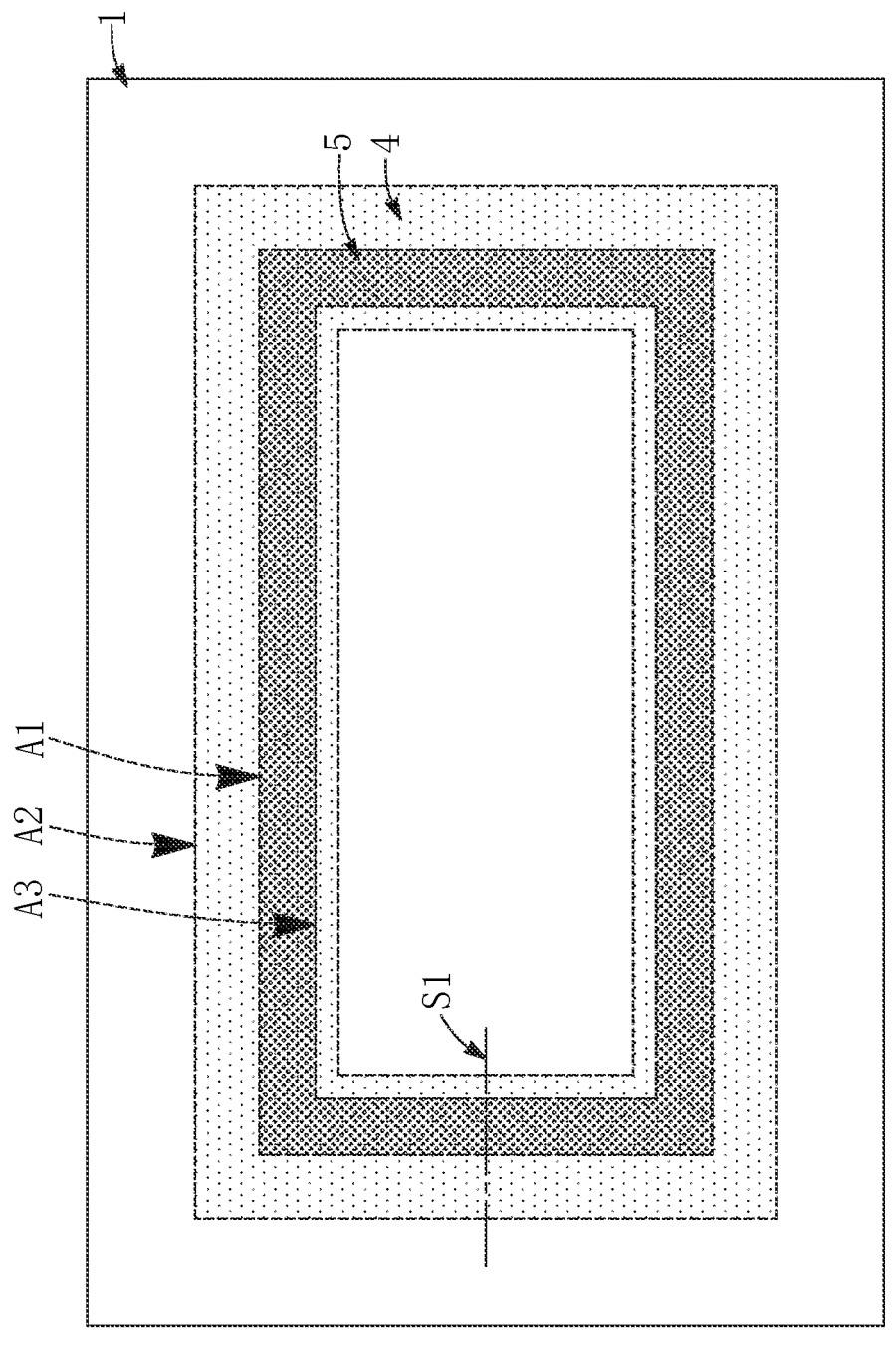
FIGS. 5A and 5B are a schematic top view and a schematic side view of step S106 according to one embodiment of the present disclosure, respectively.
Figure 5B:
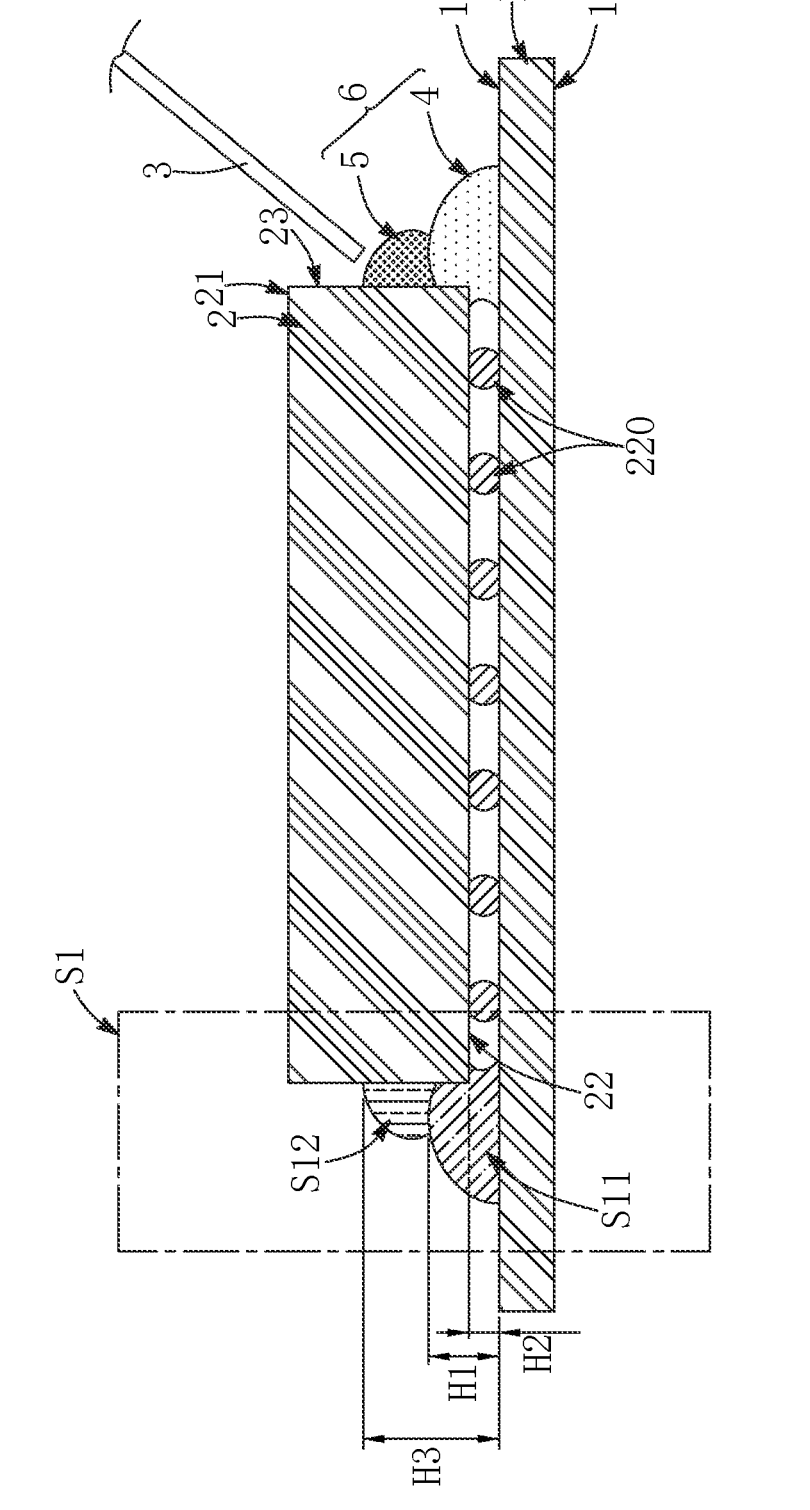
Figure 5C:
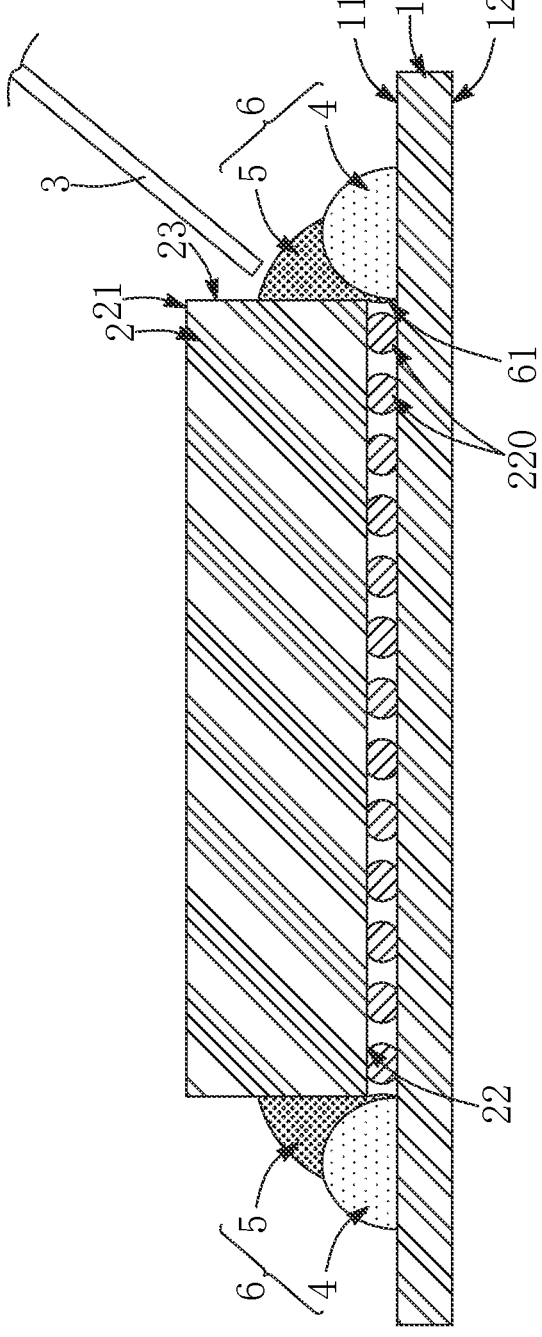
FIG. 5C is another schematic side view of step S106 according to one embodiment of the present disclosure.
Figure 5D:
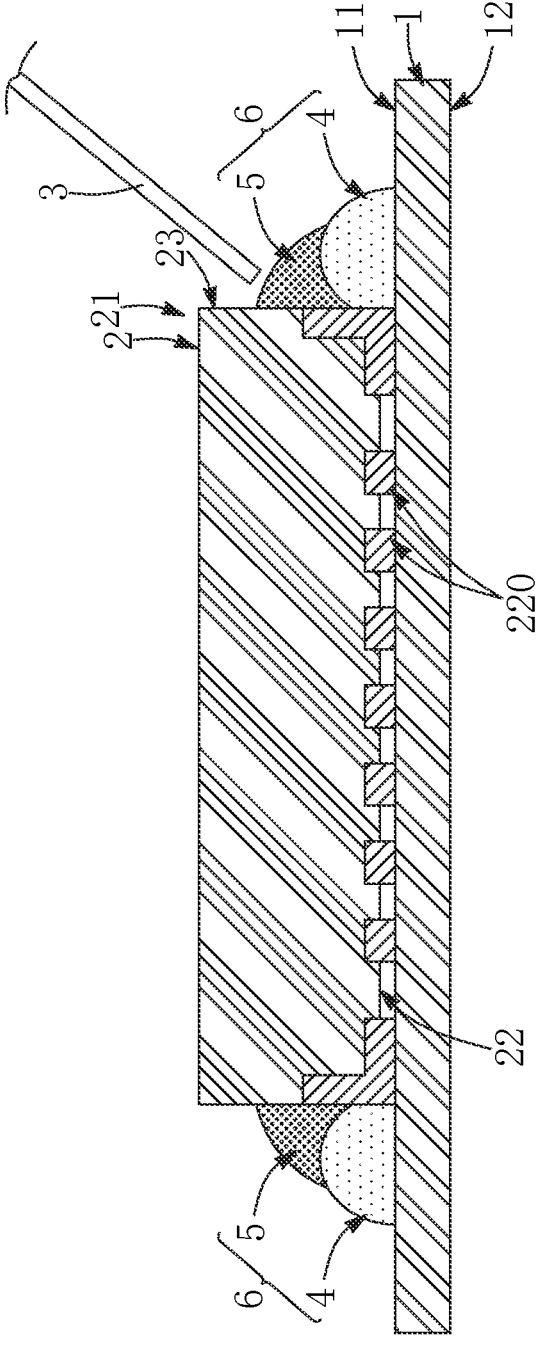
FIG. 5D is yet another schematic view of step S106 according to one embodiment of the present disclosure.

Reference is made to FIGS. 5A, 5B and 5C, FIGS. 5A and 5B are a schematic top view and a schematic side view of step S106 according to one embodiment of the present disclosure, respectively, FIG. 5C is another schematic side view of step S106 according to one embodiment of the present disclosure, and FIG. 5D is yet another schematic view of step S106 according to one embodiment of the present disclosure. As shown in FIG. 5A and FIG. 5B, a second adhesive 5 can be disposed, through the needle cylinder 3, on the first adhesive 4 along the side surface 23 of the semiconductor package 2, and in the second region A2 shown in FIG. 5A, such that a package structure 100 is formed.

It can be seen from FIG. 5A that, in the package structure 100, a dispensing position of the second dispensing step is closer to the side surface 23 of the semiconductor package 2 than the first dispensing step. It can also be seen from FIG. 5B that a height of the dispensing position in the second dispensing step is higher than a height of the dispensing position in the first dispensing step. In this way, which is the so-called "segmented dispensing from the outside to the inside" mentioned above, by forming the second adhesive 5 between the semiconductor package 2 and the first adhesive 4, or more specifically, by setting the dispensing position of the second dispensing step between the dispensing position of the first dispensing step and the side surface 23 of the semiconductor package 2, since the adhesive is dispensed close to an edge of the semiconductor package 2 and a height of the overall adhesive is achieved by continuously stacking the first adhesive 4 and the second adhesive 5, a height, a width and an underneath penetration of a pier adhesive 6 formed at the edge of the semiconductor package 2 can be precisely controlled to achieve a desired shape of a side-filled adhesive.

In addition to the above-mentioned positional differences, an amount of adhesive used in the second dispensing step may be the same or less than an amount of adhesive used in the first dispensing step. In more detail, the difference in the amount of adhesive mentioned here does not refer to a difference in a total amount of adhesive used on all side surfaces of the semiconductor package 2 (e.g., all four side surfaces of the semiconductor package 2). As shown in FIGS. 5A and 5B, an imaginary plane S1 is provided and is perpendicular to both the first board surface 11 and the upper surface 21, and the imaginary plane S1 spans from the first region A1 to the second region A2. Apparently, it can be seen from FIG. 5B that a first cross-sectional area S11 of the first adhesive 4 in the imaginary plane S1 is larger than a second cross-sectional area S12 of the second adhesive 5 in the imaginary plane S1. In addition, in this embodiment, the highest point of the formed pier adhesive 6 is located on the side surface 23, and the pier adhesive 6 is connected to at least one portion of the side surface 23. In other embodiments, when the height H2 of the lower surface 22 of the semiconductor package 2 is relatively low, or the pins 220 and their solder joints are distant from the side surface 23, the first adhesive 4 can contact the side surface 23 and the lower surface 22. For example, the pins 220 are formed in a form of a non-ball grid array (no solder balls), such as a dual in-line package or a quad flat package.

Referring to FIG. 5C, the second adhesive 5 can be further disposed at a position above the first adhesive 4 that is set in FIG. 4C (i.e., between the first adhesive 4 and the side surface 23), thereby forming the pier adhesive 6. It should be noted that, since only the second adhesive 5 is used to connect the first adhesive 4 with the side surface 23 in the embodiment of FIG. 5C, the second adhesive 5 flows downward (i.e., a direction of gravity) after being dispensed, such that the pier adhesive 6 contacts a portion of the lower surface 22 or does not contact with the lower surface 22 after the shape of the pier adhesive 6 is stabilized. A location of an inner surface 61 of the pier adhesive 6 that faces the pins 220 can then be controlled at an outer edge of a vertical projection that is projected onto the upper board surface 11 by the outer region A5, thereby preventing a final shape of the pier adhesive 6 from contacting the pins 220.

In the embodiments of FIGS. 5A to 5C, the pins 220 are presented in a form of a ball grid array (BGA). However, since solder balls (e.g., tin balls) are not materially rigid, if the adhesive contacts the pins 220, the adhesive, the PCB substrate and BGA package may be bent due to differences in thermal expansion coefficient (thermal stress), or may be stretched and vibrated (mechanical stress), which may cause solder joints to break. Therefore, when the pins 220 are electrically connected to the substrate 1 in the ball grid array packaging manner, it is necessary to ensure that neither the first adhesive 4 nor the second adhesive 5 contacts any of the pins 220, and also needs to ensure that the pier adhesive 6 formed subsequently does not contact any of the pins 220, thereby avoiding the solder joint from being broken.

Reference is made to FIG. 5D, which is yet another schematic view of step S106 according to one embodiment of the present disclosure. In the embodiment of FIG. 5D, the pins 220 are presented in the form of the QFN. In this case, due to high structural stability of the pins 220, sufficient material stiffness can be provided. Therefore, as long as the underneath penetration of the adhesive is precisely controlled, for example, the adhesive is controlled to not reach the lower surface 22, or is controlled to only slightly penetrate to contact the lower surface 22, the first adhesive 4, the second adhesive 5, or the subsequently formed pier adhesive 6 can contact a part of the pins 220 under the premise that the first adhesive 4 or the second adhesive 5 does not completely wrap around any one of the pins 220, especially for the pins 220 that are closest to the side surface 23.

Figure 6:
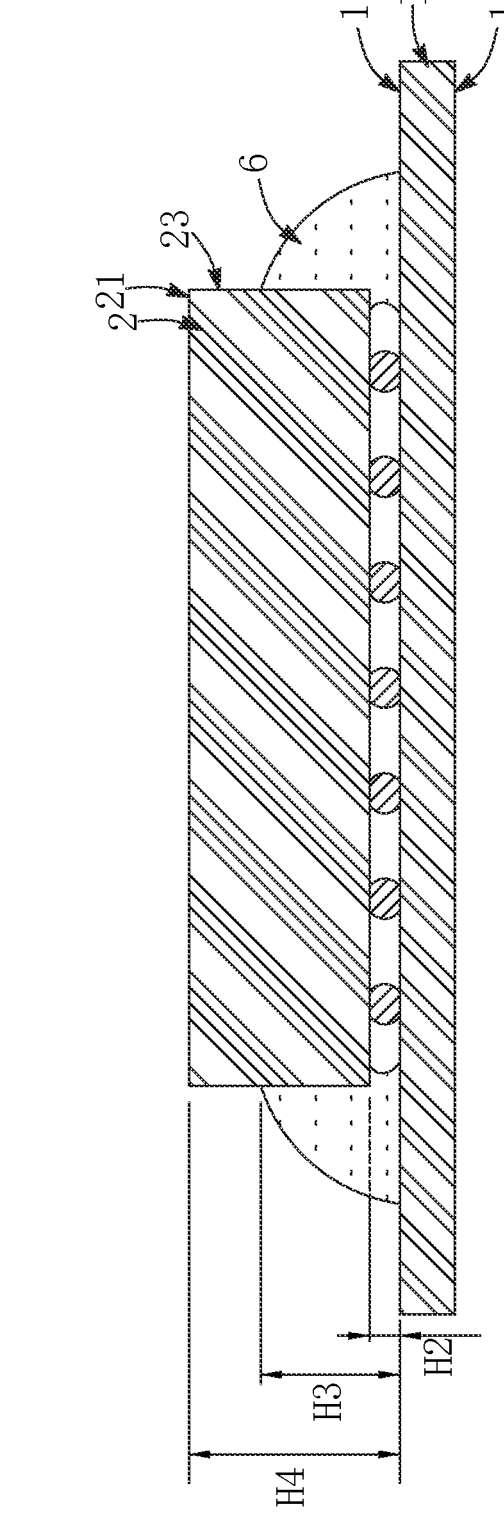
FIG. 6 is another schematic side view of the package structure according to one embodiment of the present disclosure.

It should be noted that the second adhesive 5 can be an adhesive having the same or similar properties of the adhesive material as the first adhesive 4, as shown in Table I above. Therefore, since the first adhesive 4 and the second adhesive 5 are made of adhesive materials having similar properties, the pier adhesive 6 has an obviously layered shape showing that the pier adhesive 6 is formed by two adhesives. Reference is made to FIG. 6, which is another schematic side view of the package structure according to one embodiment of the present disclosure. As shown in FIG. 6, in the package structure 100, when the properties of the adhesive materials used for the first adhesive 4 and the second adhesive 5 are more similar, larger amount of the adhesive material are used, and the dispensing positions of the two adhesives are closer than the previous embodiment, the formed pier adhesive 6 may not have an obviously layered shape.

In some embodiments, a height H3 of the pier adhesive 6 is between the height of the first board surface 11 and the height of the upper surface 21. That is, when the first board surface 11 is viewed as the ground, the height of the packaged semiconductor package 5 relative to the first board surface 11 can be referred to as a package height H4, and thus the height H3 of the pier adhesive 6 is between the ground and the package height H4. In a preferred embodiment of the present disclosure, the height H3 of the pier adhesive 6 ranges between 25% and 100% of the package height H4. In more detail, if the height H3 of the pier adhesive 6 is controlled to be within the above-mentioned range, less bottom penetration can be ensured for the formed pier adhesive.

In particular, for a package structure that still requires two or three reflow processes, a pier-dispensing method utilized in the embodiments of the present disclosure can avoid excessive underneath penetration that causes the adhesives to wrap around solder balls or solder joints. Profiles of such solder balls or solder joints in the subsequent reflow processes may be affected by certain thermal expansions that cannot be eliminated, such as such as voids in high-temperature molten solder balls and solder joints or volatilization of flux, which can even lead to defects such as solder ball deformation, open circuits and short circuits of the solder joints, and interface delamination between the adhesive and the component or the PCB/substrate.

Optionally, the method for fabricating the package structure can proceed to Step S108: performing a third dispensing step to form a third adhesive between the side surface and the second adhesive, such that the third adhesive contacts both the side surface and the second adhesive, and the first adhesive, the second adhesive and the third adhesive together form a pier adhesive.

Figure 7A:
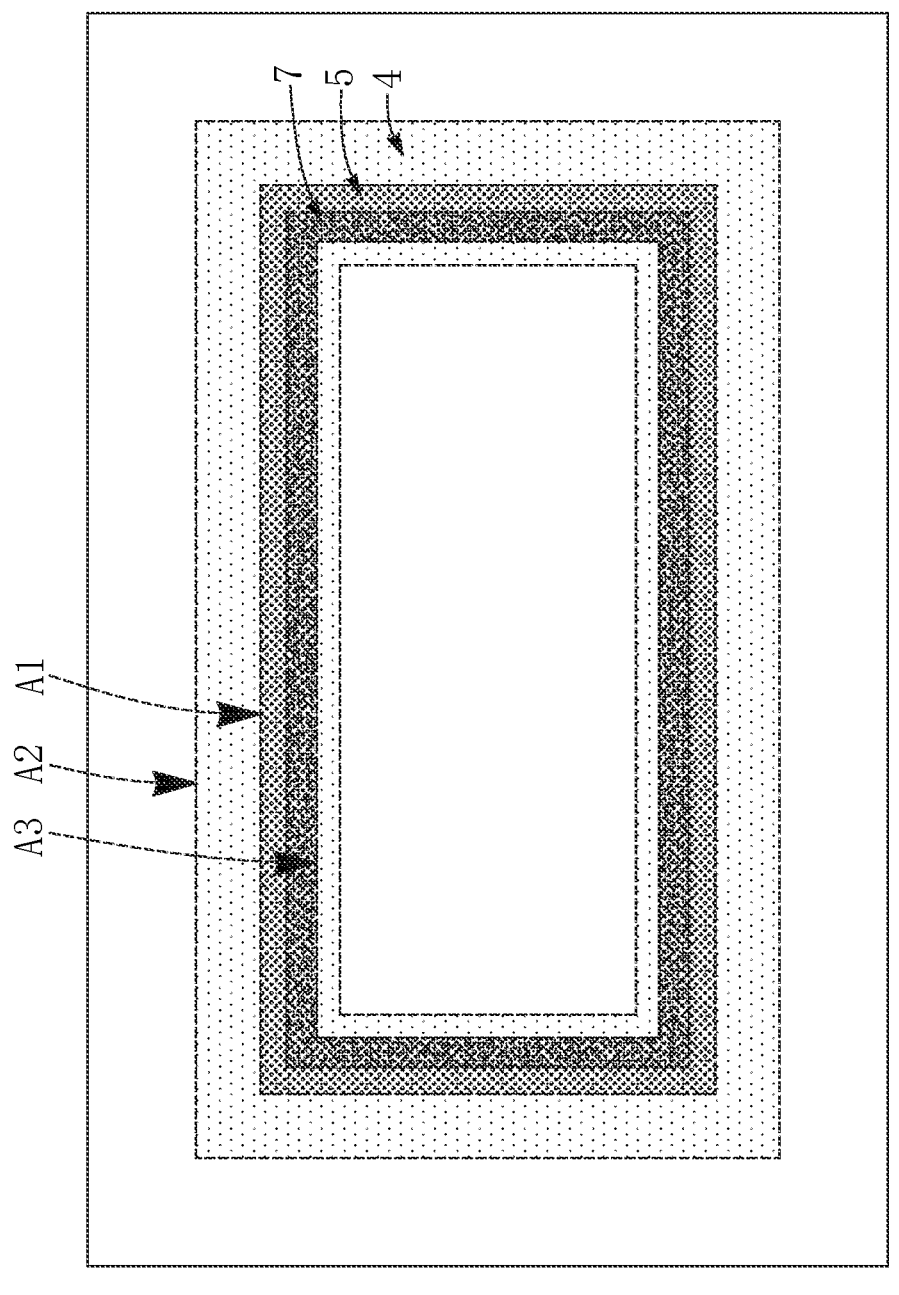
FIGS. 7A and 7B are a schematic top view and a schematic side view of step S108 according to one embodiment of the present disclosure.
Figure 7B:
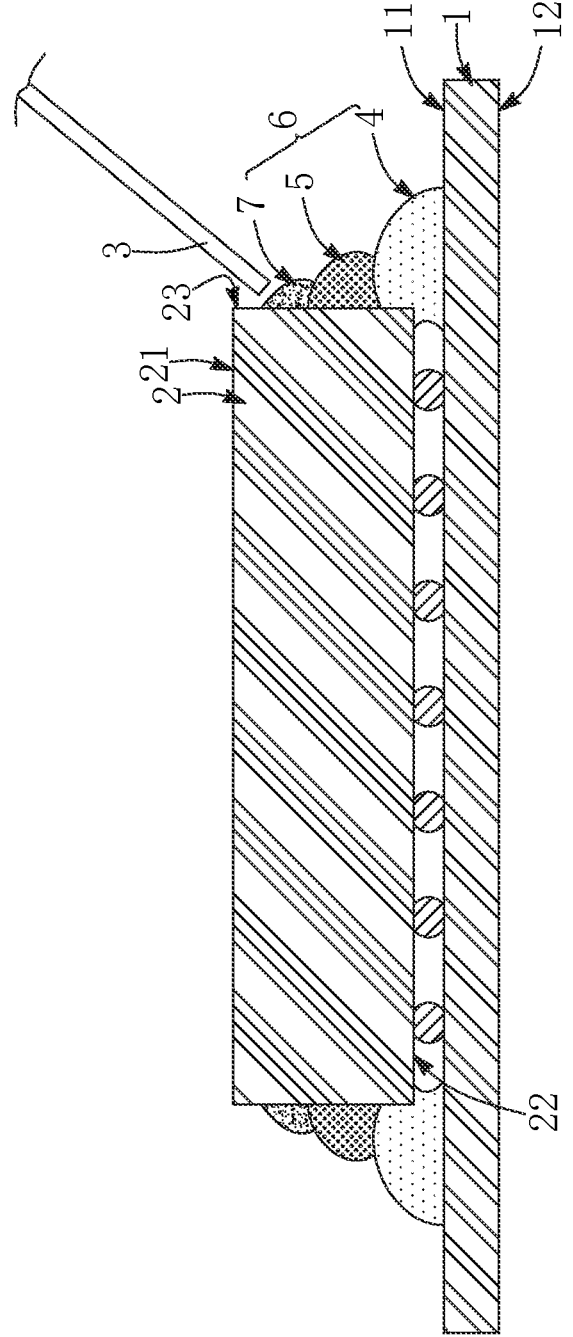

Reference is made to FIGS. 7A and 7B, FIGS. 7A and 7B are a schematic top view and a schematic side view of step S108 according to one embodiment of the present disclosure. As shown in FIG. 7A and FIG. 7B, the third adhesive 7 can be an adhesive having the same or similar properties as the first adhesive 4 and the second adhesive 5, as shown in Table 1 above. Compared with the first and second dispensing steps, a dispensing position in the third dispensing step is closer to the side surface 23 of the semiconductor package 2, and a height of the dispensing position in the third dispensing step is higher than those in the first and second dispensing steps. Therefore, as shown in FIG. 7B, the pier adhesive 6 may have a layered form formed by three adhesives. This step shows that the method for fabricating the package structure provided by the present disclosure is not limited to two dispensing steps, and three or more dispensing steps can be performed from the outside to the inside to form the desired structure of the pier adhesive 6.

Reference is made to FIGS. 8 to 17, which show various implementations of the first adhesive and the second adhesive according to one embodiment of the present disclosure.

As shown in aforementioned FIG. 5A, the first region A1 is rectangular having four sides. Therefore, the second region A2 disposed around the first region A1 can also be rectangular and have four sides.

Figure 8:
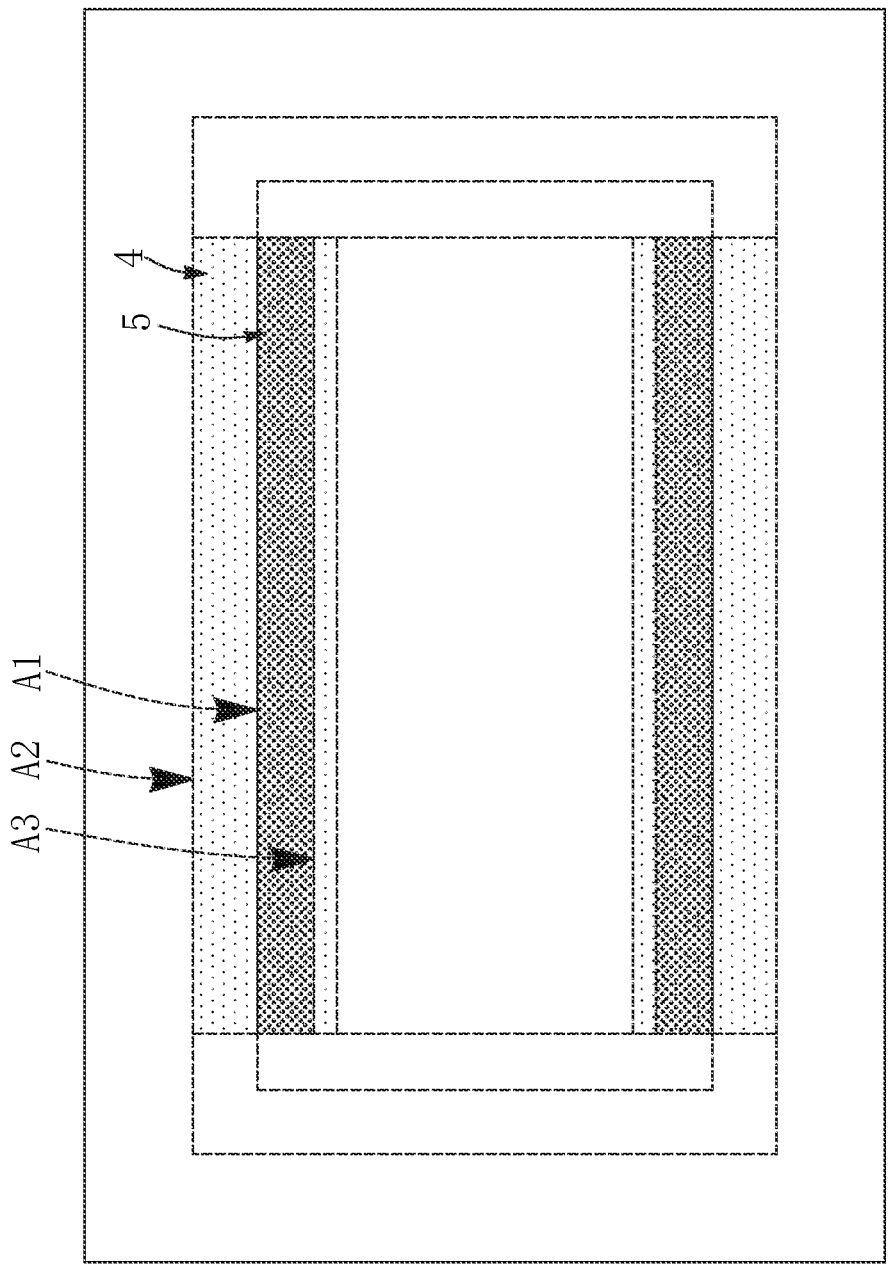
FIGS. 8 to 17 show various implementations of the first adhesive and the second adhesive according to one embodiment of the present disclosure.
Figure 9:
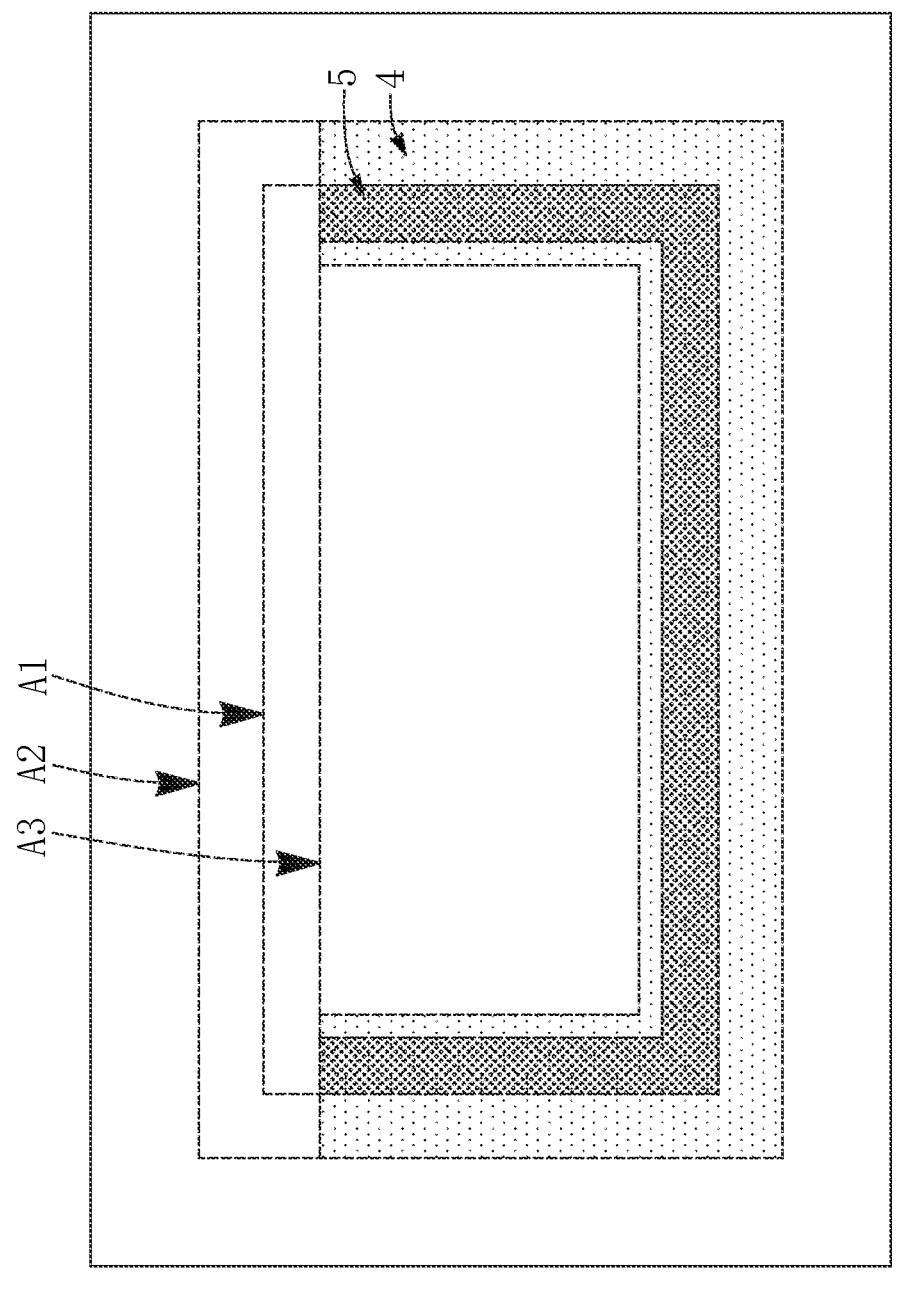

It should be noted that, in addition to forming the first adhesive 4 and the second adhesive 5 along all of the sides of the first region A1 as shown in FIG. 5A, the first adhesive 4 and the second adhesive 5 can be formed along two of the sides of the first region A1 as shown in FIG. 8, and the first adhesive 4 and the second adhesive 5 can also be formed along three of the sides of the first region A1 as shown in FIG. 9. In other words, the first adhesive 4 and the second adhesive 5 can be formed along at least two of the four sides of the first region A1, while the first adhesive 4 and the second adhesive 5 are not formed along at most two sides.

It should be noted that, in order to prevent the package structure 1 from being deformed or damaged during thermal expansion and contraction of the solder ball solder joints or the air at the bottom of the packaged components in reflow processes or in a thermal cycling of a product reliability verification process, it is necessary to provide an outgassing path between the bottom of the semiconductor package 2 and the pier adhesive 6. Therefore, two sides where the first adhesive 4 and the second adhesive 5 are not formed at as shown in FIG. 8 and one side where the first adhesive 4 and the second adhesive 5 are not formed at as shown in FIG. 9 will be used as reserved opening(s) such that the air at the bottom of the semiconductor package 2 has enough space to be discharged outwards during the thermal expansion and contraction.

Figure 10:
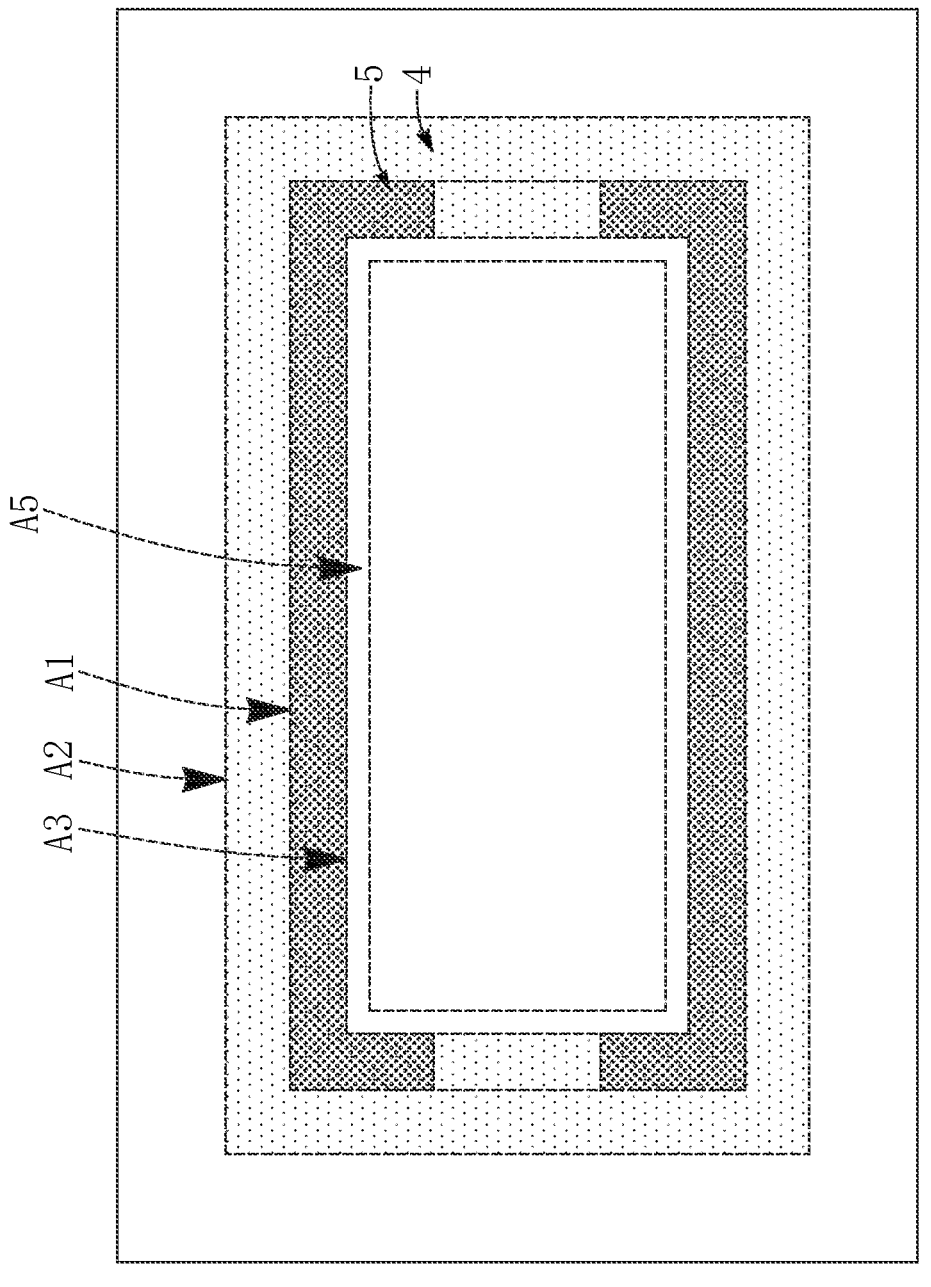

In other embodiments, as shown in FIG. 10, all of the sides of the first region A1 are formed with the first adhesive 4 and the second adhesive 5, but for two opposite ones of the sides, a part of each of the two opposite sides is not provided with the second adhesive 5. In other words, the second adhesive 5 may not be formed in a part of the two opposite sides of the first region A1. Similarly, another outgassing path needs to be provided between the bottom of the semiconductor package 2 and the pier adhesive 6, and in FIG. 10, in a part of the two sides where only the first adhesive 4 is formed, the first adhesive 4 will not contact the side surface 23 and the lower surface 22 of the semiconductor package 2, so as to reserve openings for the air at the bottom of the semiconductor package body 2 and to provide enough space for the air to be discharged to the outside during the thermal expansion and contraction. That is to say, the first adhesive 4 may be provided in a manner similar to FIG. 4C and FIG. 5C to reserve the required openings under the premise of not overlapping with the outer region A5 of the lower surface 22.

Figure 11:
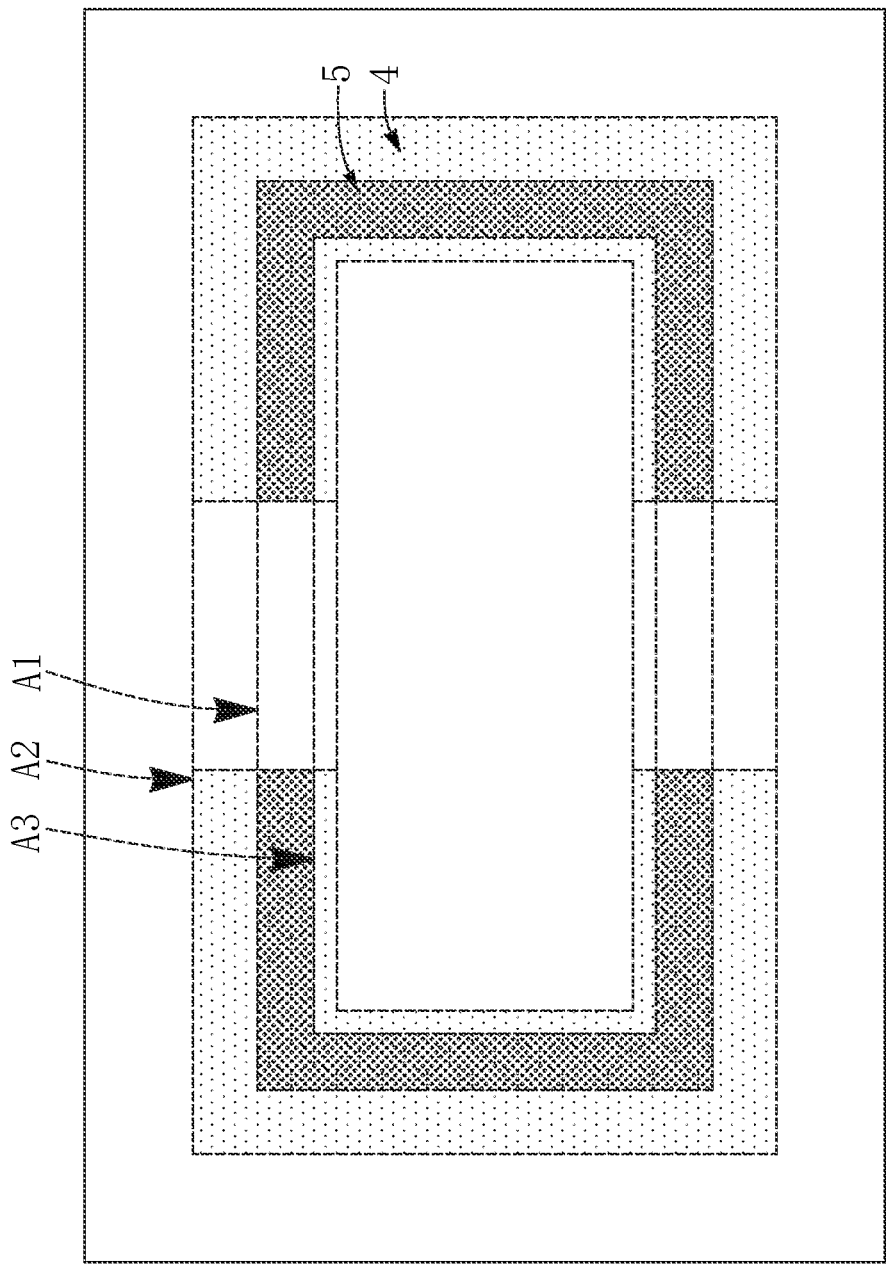

In other embodiments, as shown in FIG. 11, except that the second adhesive 5 may not be formed in a part of the two opposite sides of the first region A1, for the two opposite sides, the first adhesive 4 is not formed at the part where the second adhesive 5 is not formed. That is, neither the first adhesive 4 nor the second adhesive 5 is formed along a part of the two opposite sides, so as to reserve openings.

Figure 12:
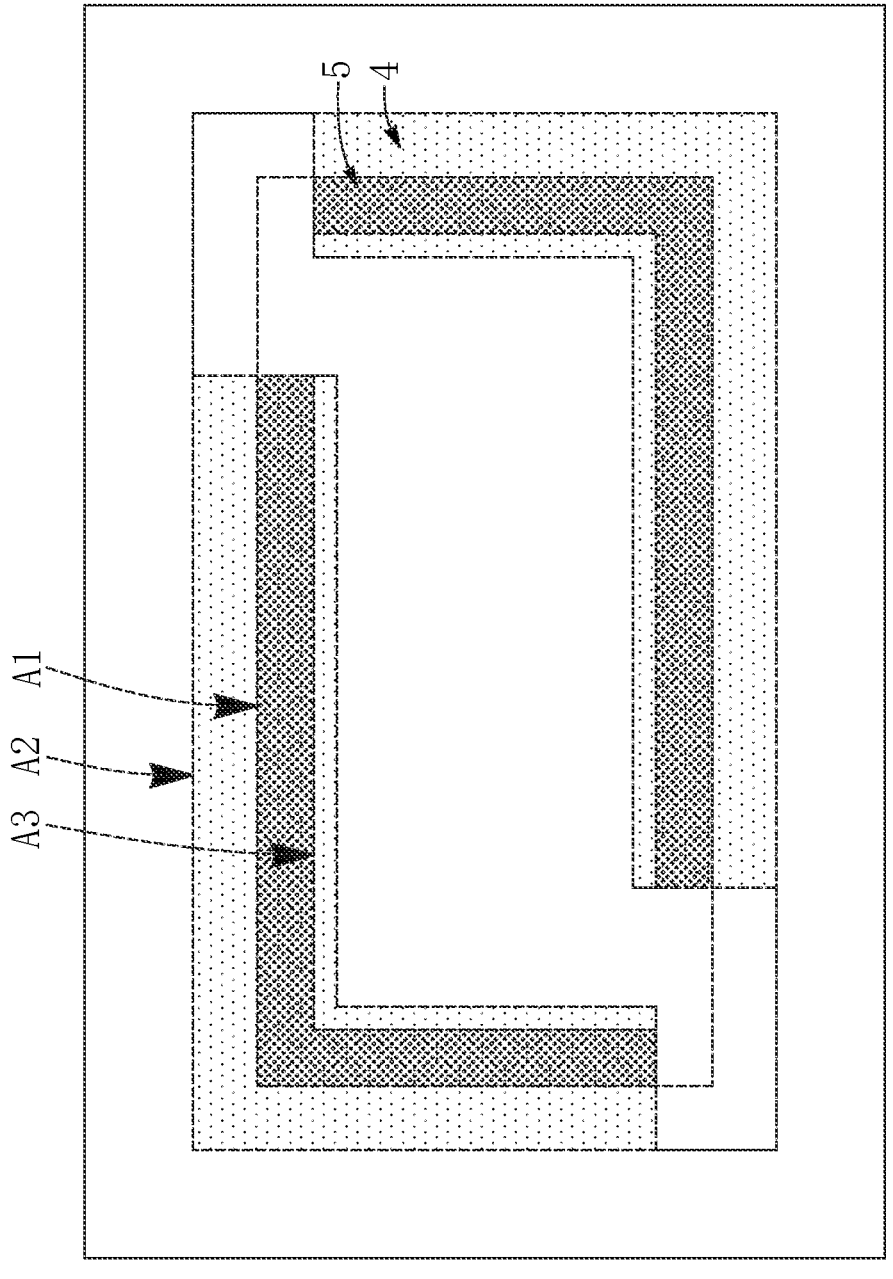

Similarly, FIG. 12 shows another aspect of the package structure based on FIG. 11. For two opposite ones of the sides, the first adhesive 4 and the second adhesive 5 are not formed at a part of each of the two opposite sides. Therefore, the parts where no adhesive is formed are arranged along a diagonal of the first region A1.

Figure 13:
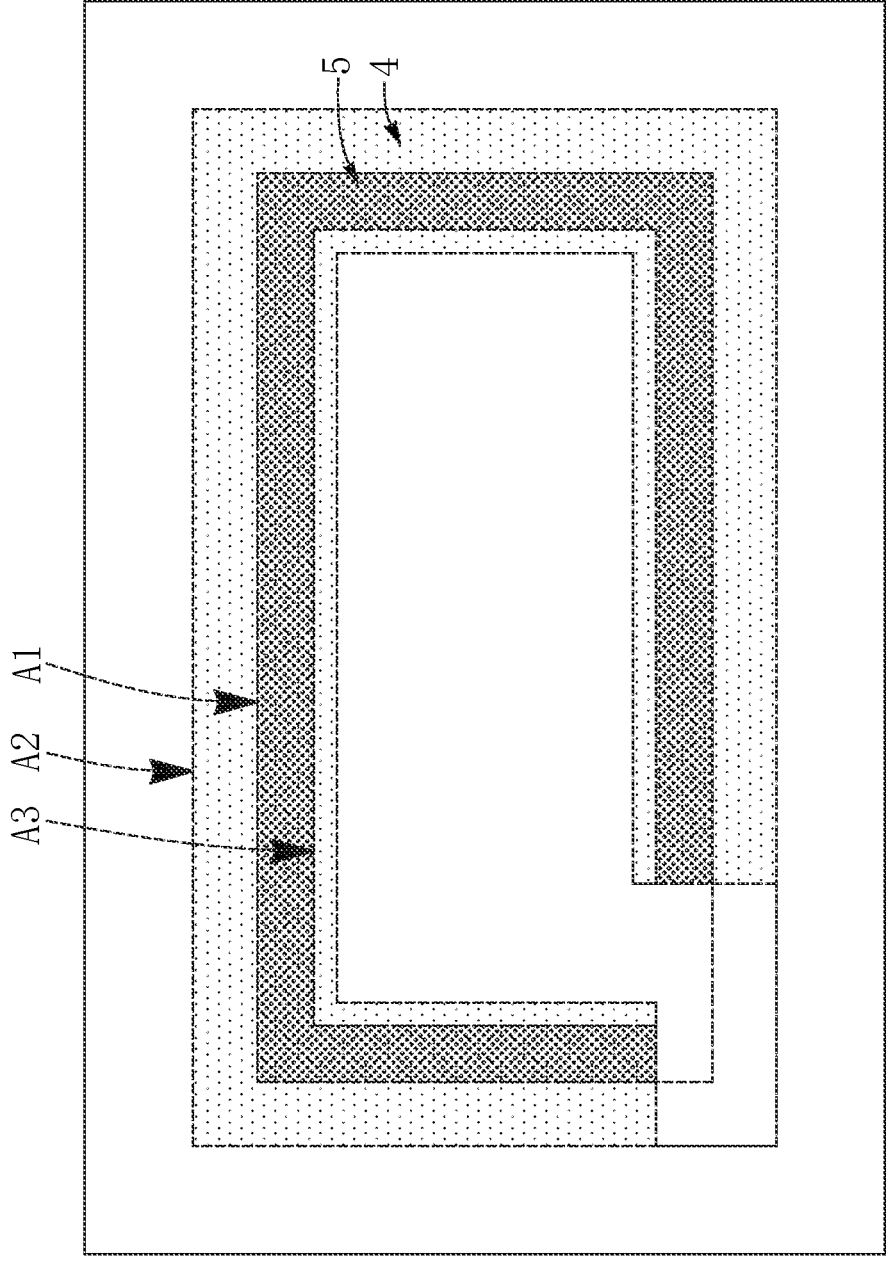
Figure 14:
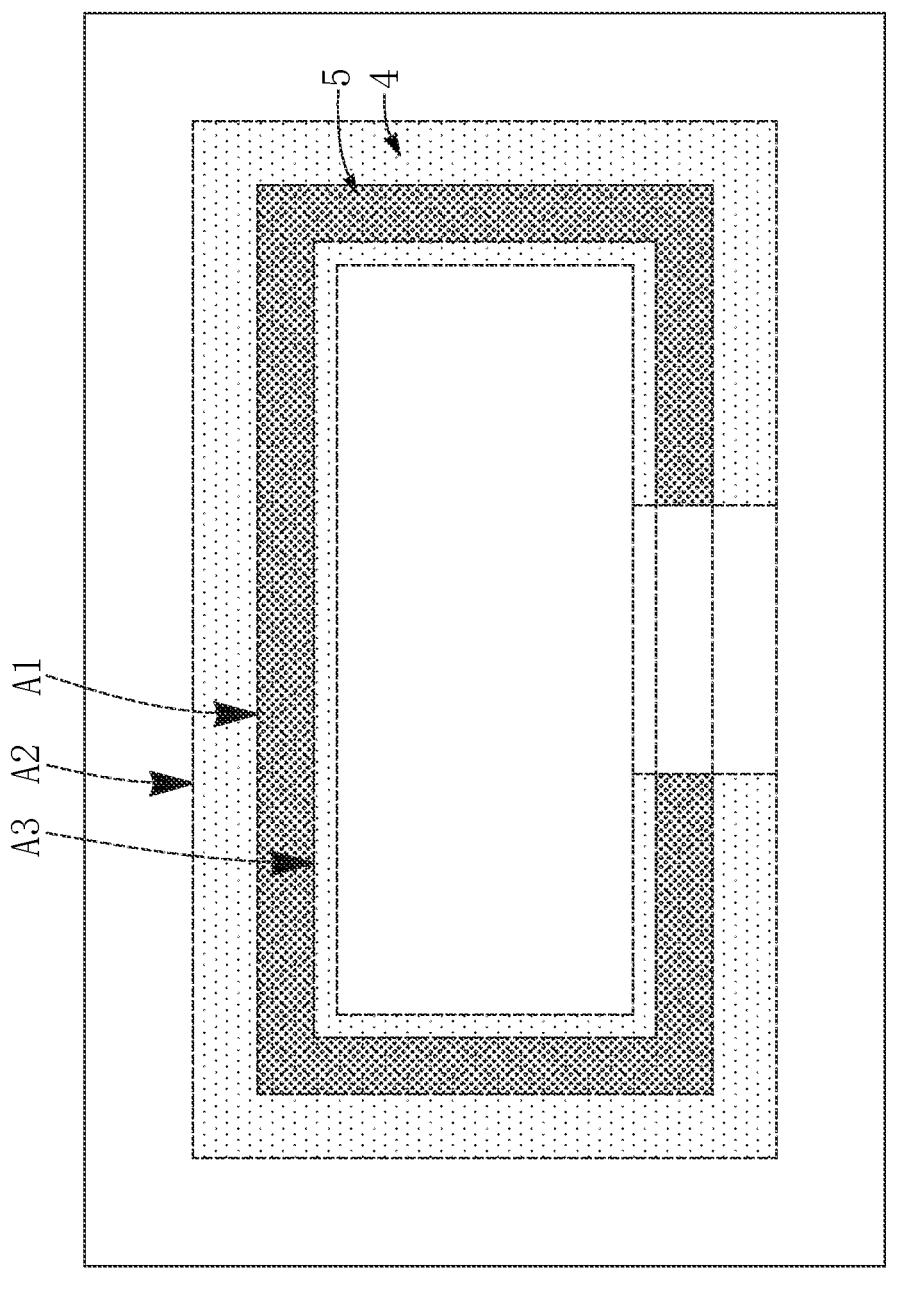

In other embodiments, as shown in FIG. 13 and FIG. 14, the first adhesive 4 and the second adhesive 5 are formed along all of the four sides of the first region A1, but a part of one of the sides is provided without any adhesive. That is, the first adhesive 4 and the second adhesive 5 are not formed along the part of one of the edges of the first region A1, and the part may serve as a reserved opening. As shown in FIGS. 13 and 14, the part that is provide without any adhesive may be at a center or at ends of that side.

Figure 15:
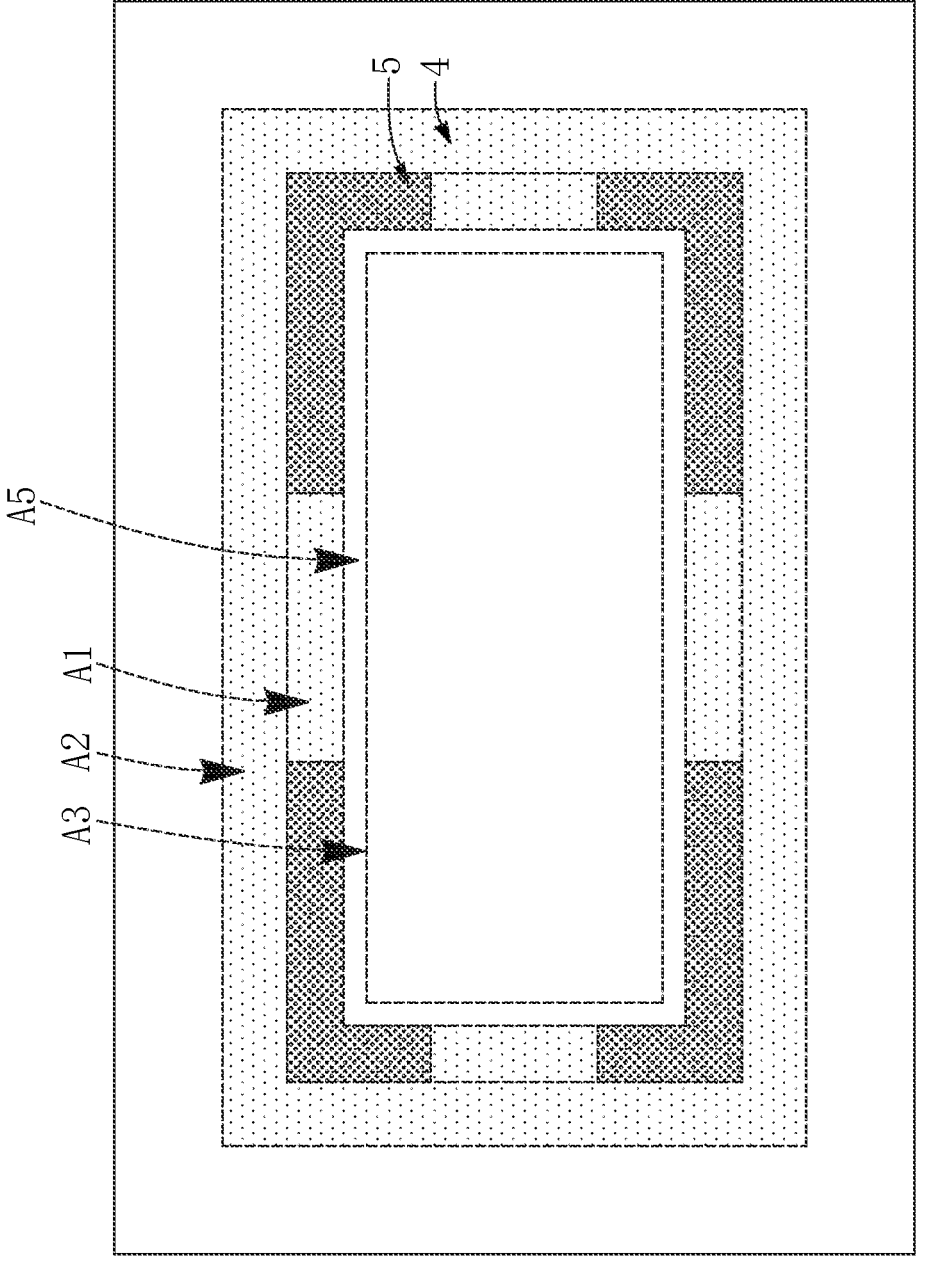

In other embodiments, as shown in FIG. 15, the first adhesive 4 and the second adhesive 5 are formed along all four sides of the first region A1, but a part is provided without the second adhesive 5 for each of the four sides. That is, the second adhesive 5 is not formed along a part of each of the sides of the first region A1. In FIG. 15, in those parts of all sides where only the first adhesive 4 are formed, the first adhesive 4 does not contact the side surface 23 and the lower surface 22 of the semiconductor package 2, so as to reserve openings the air of the bottom of the semiconductor package 2 and provide enough space for the air to be discharged during the thermal expansions and contractions. That is, the first adhesive 4 may be provided in a manner similar to FIG. 4C to reserve the required openings on the premise of not overlapping with the outer region A5 of the lower surface 22. In addition, in the embodiments of FIGS. 8 to 14, although the first adhesive 4 overlaps with the outer region A5 of the lower surface 22, the present disclosure is not limited thereto. In other words, the first adhesive 4 can also be provided on the premise that the first adhesive 4 does not overlap with the outer region A5 of the lower surface 22.

Figure 16:
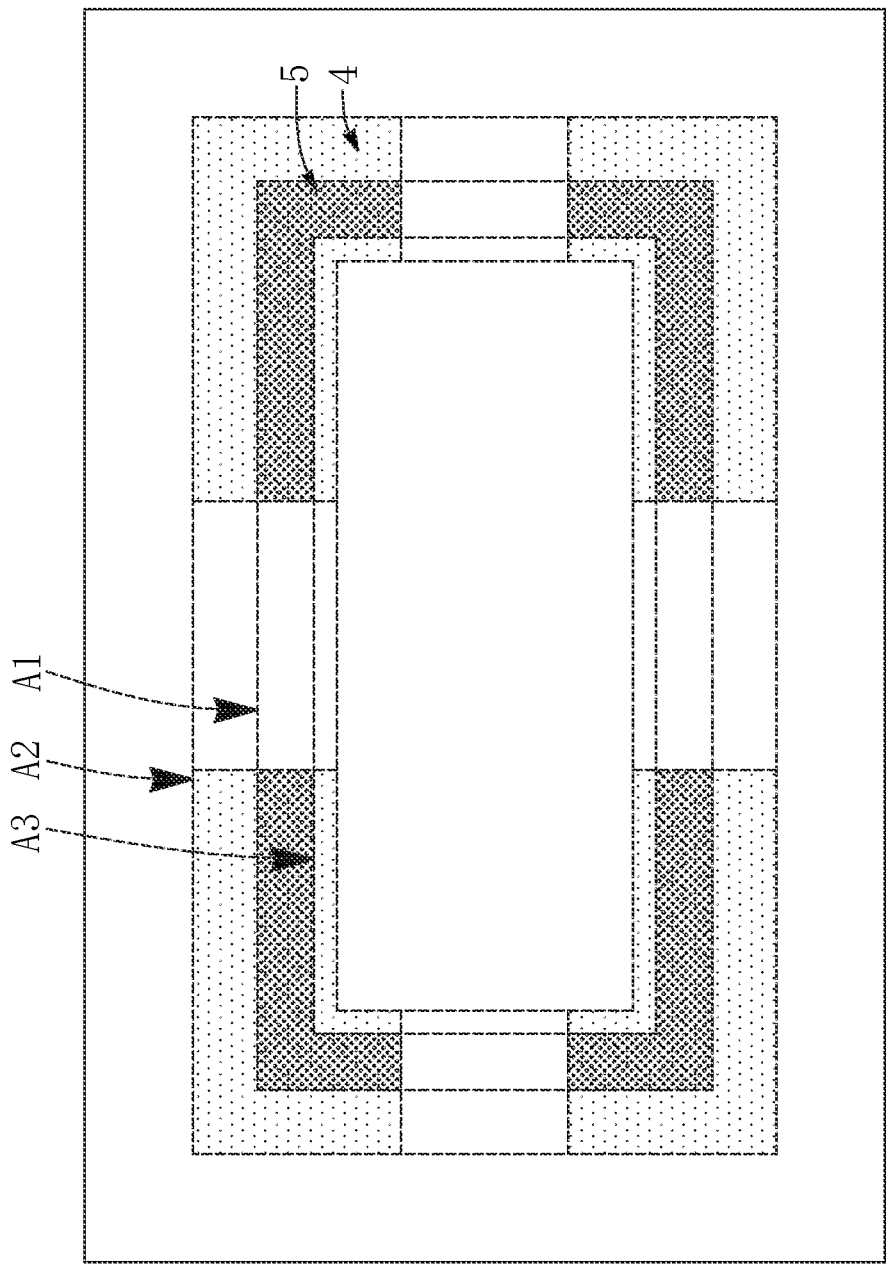
Figure 17:
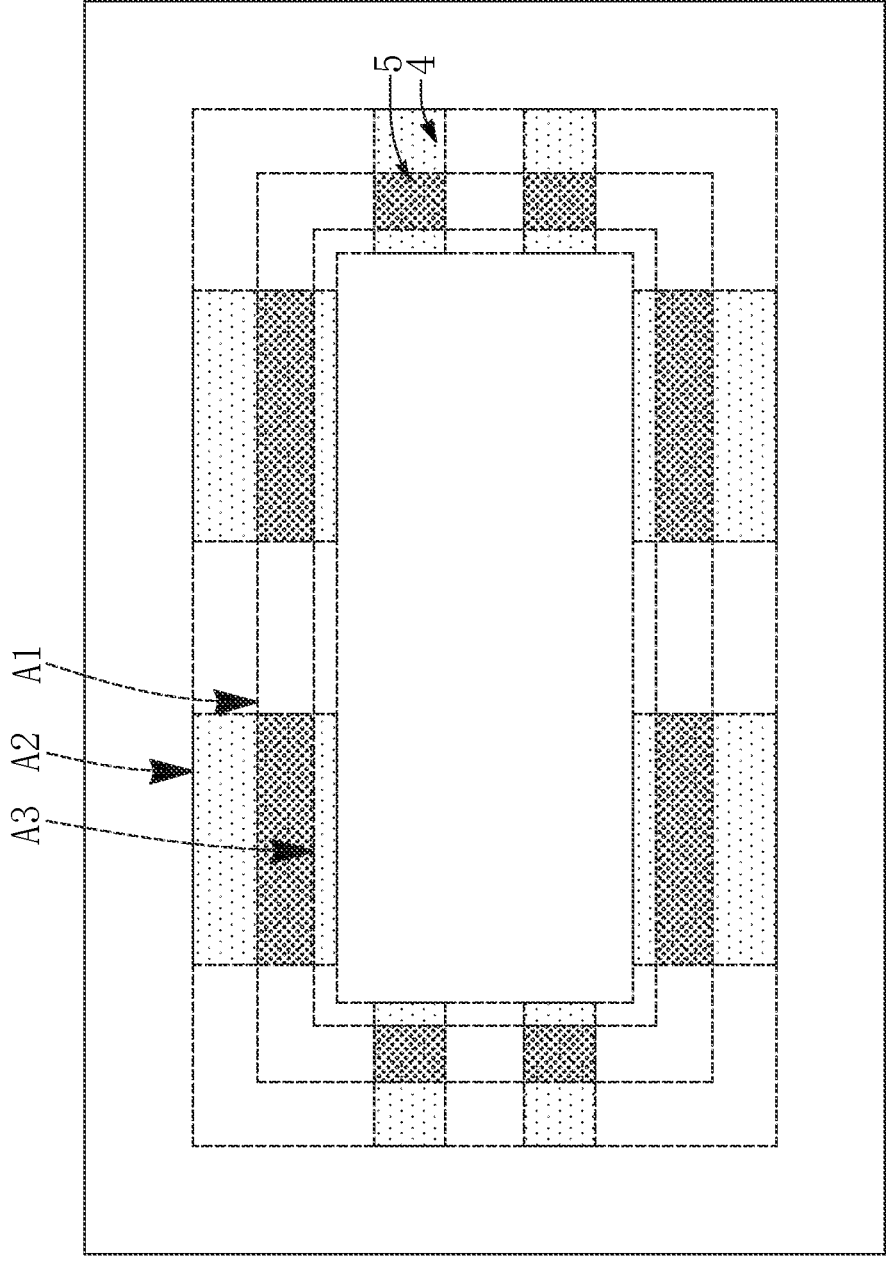

In other embodiments, as shown in FIGS. 16 and 17, the first adhesive 4 and the second adhesive 5 are formed along all four sides of the first region A1, but a part is provided without the first adhesive 4 and the second adhesive 5 for each of the four sides, and the part can serve as a reserved opening. In particular, in FIG. 17, the part of each side where the first adhesive 4 and the second adhesive 5 are not formed is divided into two or more sections, such that a symmetrical structure can be maintained under the premise of using a small amount of adhesive, thereby avoiding defects such as deformation of solder balls, disconnection of solder joints, and interface delamination between the adhesive and the component or the printed circuit board/substrate.

Beneficial Effects of the Embodiments

In conclusion, in the package structure and the method for fabricating the same provided by the present disclosure, a fillet height and a fillet width of a pier adhesive on the side surface can be precisely controlled by a two-stage or multi-stage dispensing process, such that sides of the semiconductor package can be strengthened to avoid abnormalities such as cracks in solder joints or open circuits, and the product reliability can be increased.

In addition, in the package structure and the method for fabricating the same provided by the present disclosure, a pier structure formed by the two or multi-stage dispensing process can be utilized to precisely control the underneath penetration of the component, thereby avoiding defects such as deformation of solder balls, disconnection of solder joints, and interface delamination between the adhesive and the component or the printed circuit board/substrate. Therefore, processes such as module cleaning, baking and plasma treatment required for the conventional underfill dispensing or the side-fill dispensing can be omitted, which greatly reduces the overall production costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:
a substrate having a first board surface, wherein a first region is located on the first board surface, and a second region is located on the first board surface and surrounds the first region;
a semiconductor package having an upper surface, a lower surface, and a side surface between the upper surface and the lower surface, wherein the semiconductor package is disposed on the first board surface and located in the first region, and is electrically connected to the substrate through a plurality of pins disposed on the lower surface;
a first adhesive formed on the first board surface, in the second region, and in a portion of the first region adjacent to the second region, wherein the first adhesive is free from contacting the plurality of pins of the lower surface of the semiconductor package; and
a second adhesive formed between the side surface and the first adhesive,
wherein the second adhesive contacts both the side surface and the first adhesive, the first adhesive and the second adhesive together form a pier adhesive, and the pier adhesive is connected to at least one portion of the side surface,
wherein a highest point of the pier adhesive is located on the side surface.

2. The package structure according to claim 1, wherein a height of the pier adhesive ranges from 25% to 100% of a height of the semiconductor package.

3. The package structure according to claim 1, wherein a height of the first adhesive is at least higher than a height of the lower surface, the first adhesive does not contact the side surface and the lower surface, and the second adhesive contacts the side surface.

4. The package structure according to claim 1, wherein the lower surface is divided into an inner region and an outer region surrounding the inner region, the plurality of pins are disposed in the inner region, the first adhesive contacts the outer region of the lower surface, and the first adhesive contacts the side surface and the lower surface at the same time.

5. The packaging structure according to claim 1, wherein the first region is a rectangle having four sides.

6. The package structure according to claim 5, wherein the first adhesive and the second adhesive are formed along at least two of the sides.

7. The package structure according to claim 5, wherein the first adhesive and the second adhesive are formed along the four sides, but the second adhesive is not formed along a part of two opposite ones of the four sides.

8. The package structure according to claim 7, wherein the first adhesive is also not formed along a portion of the opposite ones of the four sides.

9. The package structure according to claim 5, wherein the first adhesive and the second adhesive are formed along the four sides, but the first adhesive and the second adhesive are not formed along a part of one of the four sides.

10. The package structure according to claim 5, wherein the first adhesive and the second adhesive are formed along the four sides, but the second adhesive is not formed along a part of each of the four sides.

11. The package structure according to claim 10, wherein the first adhesive is not formed along a portion of each of the four sides.

12. The package structure according to claim 1, wherein an imaginary plane is defined as being perpendicular to both the first board surface and the upper surface and spans from the first region to the second region, and a first cross-sectional area of the first adhesive on the imaginary plane is larger than a second cross-sectional area of the second adhesive on the imaginary plane.

13. The package structure according to claim 1, wherein the plurality of pins are a plurality of solder balls, and are electrically connected to the substrate through a ball grid array packaging manner, and the first adhesive and the second adhesive are not in contact with the plurality of pins.

14. A package structure, comprising:
a substrate having a first board surface, wherein a first region is located on the first board surface, and a second region is located on the first board surface and surrounds the first region;
a semiconductor package having an upper surface, a lower surface, and a side surface between the upper surface and the lower surface, wherein the semiconductor package is disposed on the first board surface and located in the first region, and is electrically connected to the substrate through a plurality of pins disposed on the lower surface;
a first adhesive formed on the first board surface, in the second region, and in a portion of the first region adjacent to the second region, wherein, among the plurality of pins, the first adhesive only contacts the pins having a minimum distance to the side surface; and
a second adhesive formed between the side surface and the first adhesive,
wherein the second adhesive contacts both the side surface and the first adhesive, the first adhesive and the second adhesive together form a pier adhesive, and the pier adhesive is connected to at least one portion of the side surface.

15. A package structure, comprising:
a substrate having a first board surface, wherein a first region is located on the first board surface, and a second region is located on the first board surface and surrounds the first region;
a semiconductor package having an upper surface, a lower surface, and a side surface between the upper surface and the lower surface, wherein the semiconductor package is disposed on the first board surface and located in the first region, and is electrically connected to the substrate through a plurality of pins disposed on the lower surface;
a first adhesive formed on the first board surface, in the second region, and in a portion of the first region adjacent to the second region; and
a second adhesive formed between the side surface and the first adhesive,
wherein the second adhesive contacts both the side surface and the first adhesive, the first adhesive and the second adhesive together form a pier adhesive, and the pier adhesive is connected to at least one portion of the side surface, wherein the first adhesive is entirely separated from the side surface and the plurality of pins, and the second adhesive is disposed between the first adhesive and the plurality of pins, wherein a highest point of the pier adhesive is located on the side surface.

* * * * *